US012628410B2

(12) United States Patent
Bao et al.

(10) Patent No.: US 12,628,410 B2
(45) Date of Patent: May 12, 2026

(54) NON-SHARED METAL GATE INTEGRATION FOR SCALED GATE ALL AROUND (GAA) TRANSISTORS

(71) Applicant: International Business Machines Corporation, Armonk, NY (US)

(72) Inventors: Ruqiang Bao, Niskayuna, NY (US); Effendi Leobandung, Stormville, NY (US); Eric Miller, Watervliet, NY (US); Charlotte DeWan Adams, Schenectady, NY (US); Cornelius Brown Peethala, Slingerlands, NY (US); Liqiao Qin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 17/823,967

(22) Filed: Sep. 1, 2022

(65) Prior Publication Data

US 2024/0079276 A1 Mar. 7, 2024

(51) Int. Cl.
H10D 84/03 (2025.01)
H10D 30/01 (2025.01)
(Continued)

(52) U.S. Cl.
CPC ......... H10D 84/038 (2025.01); H10D 30/014 (2025.01); H10D 30/031 (2025.01); H10D 30/43 (2025.01); H10D 30/6735 (2025.01); H10D 30/6739 (2025.01); H10D 30/6757 (2025.01); H10D 62/121 (2025.01); H10D 64/01318 (2026.01); H10D 84/0167 (2025.01);
(Continued)

(58) Field of Classification Search
CPC .. H10D 30/014; H10D 30/43; H10D 30/6735; H10D 30/6757; H10D 64/665–669; H10D 30/6215–6217; H10D 84/0177; H10D 64/60; H10P 14/412–414
See application file for complete search history.

(56) References Cited

U.S. PATENT DOCUMENTS

| | | | |
|---|---|---|---|
| 10,276,452 B1 | 4/2019 | Seshadri et al. | |
| 10,304,833 B1 | 5/2019 | Suvarna et al. | |

(Continued)

*Primary Examiner* — Christine S. Kim
*Assistant Examiner* — Andrew Victor Prostor
(74) *Attorney, Agent, or Firm* — CANTOR COLBURN LLP; Samuel Waldbaum

(57) ABSTRACT

Embodiments of the present invention are directed to processing methods and resulting structures for non-shared metal gate integrations for transistors. In a non-limiting embodiment of the invention, a first nanosheet stack is formed in a first region of a substrate and a second nanosheet stack is formed in a second region of the substrate. A first work function metal stack is formed around nanosheets in the first nanosheet stack and nanosheets in the second nanosheet stack, and a first sacrificial material is formed around the first work function metal stack. The first sacrificial material in the second nanosheet stack is replaced with a second sacrificial material and the first sacrificial material and the first work function metal stack in the first nanosheet stack are replaced with a second work function metal stack. The second sacrificial material in the second nanosheet stack is replaced with a third work function metal stack.

14 Claims, 12 Drawing Sheets

100

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/85* | (2025.01) |

(52) U.S. Cl.
CPC ......... *H10D 84/0177* (2025.01); *H10D 84/85*
(2025.01)

(56) References Cited

U.S. PATENT DOCUMENTS

| | | | |
|---|---|---|---|
| 10,374,034 B1 | 8/2019 | Liu et al. | |
| 10,546,925 B2 | 1/2020 | Reznicek et al. | |
| 10,692,778 B2 | 6/2020 | Bao et al. | |
| 10,867,867 B2 | 12/2020 | Chiang et al. | |
| 11,158,636 B2 | 10/2021 | Yeh et al. | |
| 11,244,871 B2 | 2/2022 | Chiang et al. | |
| 2019/0214311 A1* | 7/2019 | Seshadri | H10D 84/0177 |
| 2019/0221483 A1 | 7/2019 | Mulfinger et al. | |
| 2020/0294863 A1* | 9/2020 | Chiang | H10D 64/017 |
| 2020/0411387 A1* | 12/2020 | Chiang | H10D 30/6757 |
| 2021/0005604 A1 | 1/2021 | Ge et al. | |
| 2021/0082766 A1 | 3/2021 | Miura et al. | |
| 2021/0098455 A1* | 4/2021 | Yu | H10D 84/0177 |
| 2023/0187495 A1* | 6/2023 | Bao | H10D 30/6757 |
| | | | 257/368 |
| 2023/0395598 A1* | 12/2023 | Hung | H10D 30/6757 |

* cited by examiner

1100

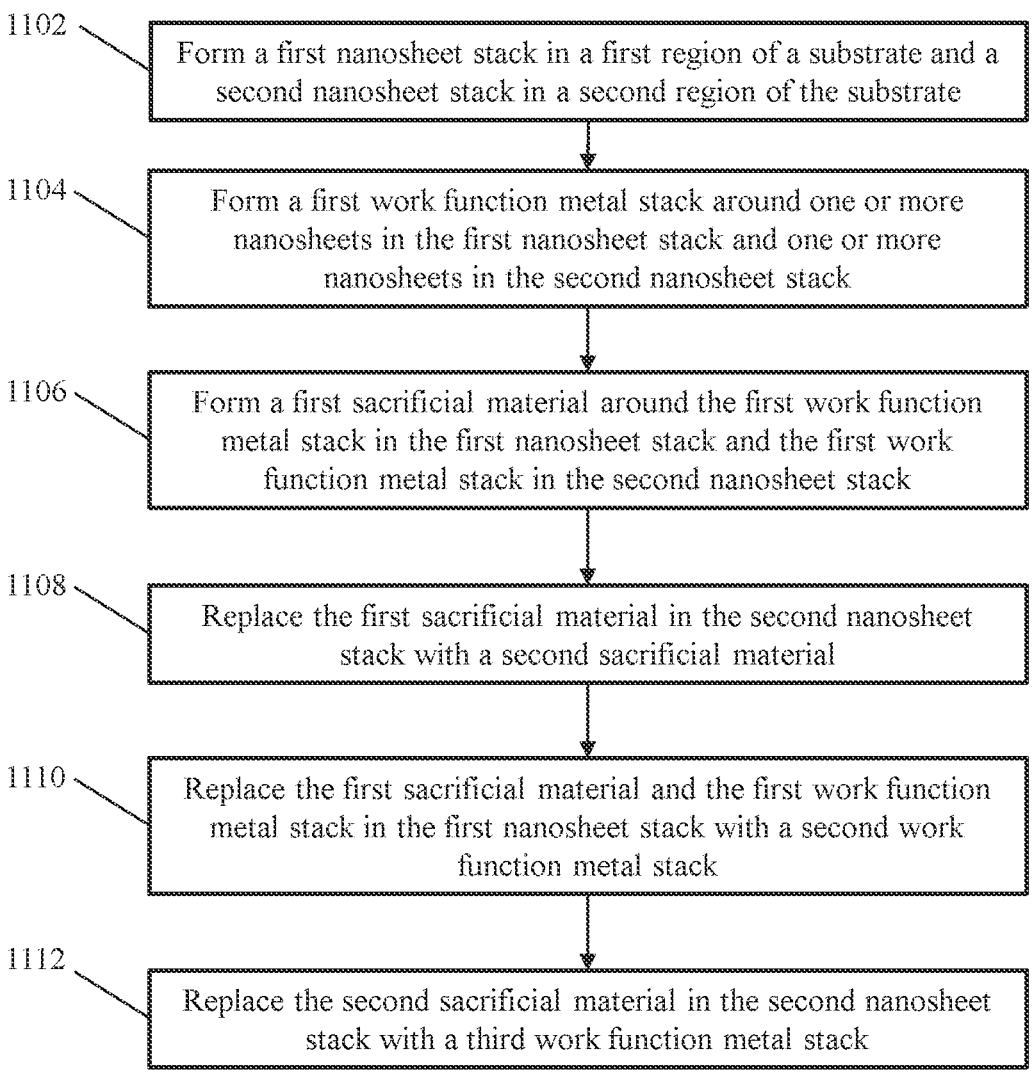

1102 — Form a first nanosheet stack in a first region of a substrate and a second nanosheet stack in a second region of the substrate 1104 — Form a first work function metal stack around one or more nanosheets in the first nanosheet stack and one or more nanosheets in the second nanosheet stack 1106 — Form a first sacrificial material around the first work function metal stack in the first nanosheet stack and the first work function metal stack in the second nanosheet stack 1108 — Replace the first sacrificial material in the second nanosheet stack with a second sacrificial material 1110 — Replace the first sacrificial material and the first work function metal stack in the first nanosheet stack with a second work function metal stack 1112 — Replace the second sacrificial material in the second nanosheet stack with a third work function metal stack

FIG. 11

1200
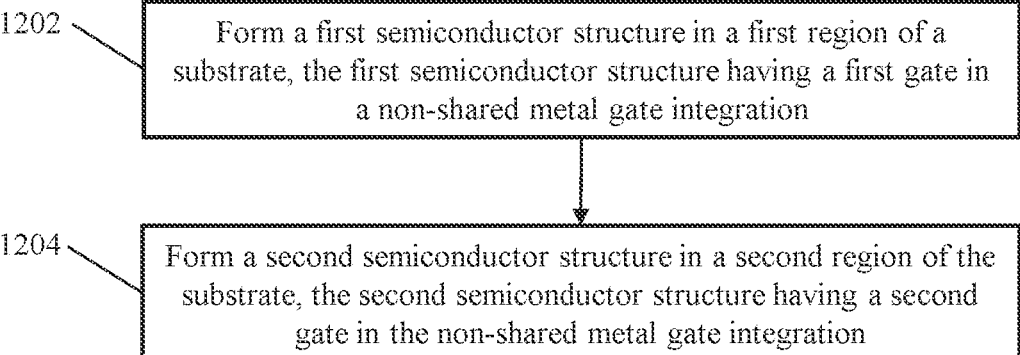
1202 — Form a first semiconductor structure in a first region of a substrate, the first semiconductor structure having a first gate in a non-shared metal gate integration
1204 — Form a second semiconductor structure in a second region of the substrate, the second semiconductor structure having a second gate in the non-shared metal gate integration
FIG. 12

NON-SHARED METAL GATE INTEGRATION FOR SCALED GATE ALL AROUND (GAA) TRANSISTORS

BACKGROUND

The present invention generally relates to fabrication methods and resulting structures for semiconductor devices, and more specifically, to processing methods and resulting structures for a non-shared metal gate integration of scaled gate all around (GAA) transistors.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, GAA transistors (also referred to as nanosheet FETs and nanowire FETs) include a non-planar architecture that provides increased device density and some increased performance over lateral devices. In nanosheet FETs, in contrast to conventional planar FETs, the channel is implemented as a plurality of stacked and spaced-apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method for forming a semiconductor device with a non-shared metal gate integration. A non-limiting example of the method includes forming a first nanosheet stack in a first region of a substrate and a second nanosheet stack in a second region of the substrate. A first work function metal stack is formed around nanosheets in the first nanosheet stack and nanosheets in the second nanosheet stack, and a first sacrificial material is formed around the first work function metal stack. The first sacrificial material in the second nanosheet stack is replaced with a second sacrificial material and the first sacrificial material and the first work function metal stack in the first nanosheet stack are replaced with a second work function metal stack. The second sacrificial material in the second nanosheet stack is replaced with a third work function metal stack.

Embodiments of the invention are directed to a method for forming a semiconductor device with a non-shared metal gate integration. A non-limiting example of the method includes forming a first semiconductor structure in a first region of a substrate having a first gate and a second semiconductor structure in a second region of the substrate having a second gate. In some embodiments, the second gate includes a first work function metal stack and a third work function metal stack and the first gate includes a second work function metal stack. In some embodiments, no work function metal stacks are shared between the first semiconductor structure and the second semiconductor structure, while gate dielectrics are shared between the first gate and the second gate.

Embodiments of the invention are directed to a semiconductor structure. A non-limiting example of the semiconductor structure includes a first semiconductor structure in a first region of a substrate. The first semiconductor structure includes a first gate formed over channel regions of the first semiconductor structure. A second semiconductor structure is in a second region of the substrate. The second semiconductor structure includes a second gate formed over channel regions of the second semiconductor structure. The second gate includes a first work function metal stack and a third work function metal stack and the first gate includes a second work function metal stack. The semiconductor structure includes a non-shared work function metal integration, such that no work function metal stacks are shared between the first semiconductor structure and the second semiconductor structure and such that gate dielectrics are shared between the first gate and the second gate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 11 depicts a flow diagram illustrating a method according to one or more embodiments of the invention; and FIG. 12 depicts a flow diagram illustrating a method according to one or more embodiments of the invention.

Figures 1A, 1B, 1C:
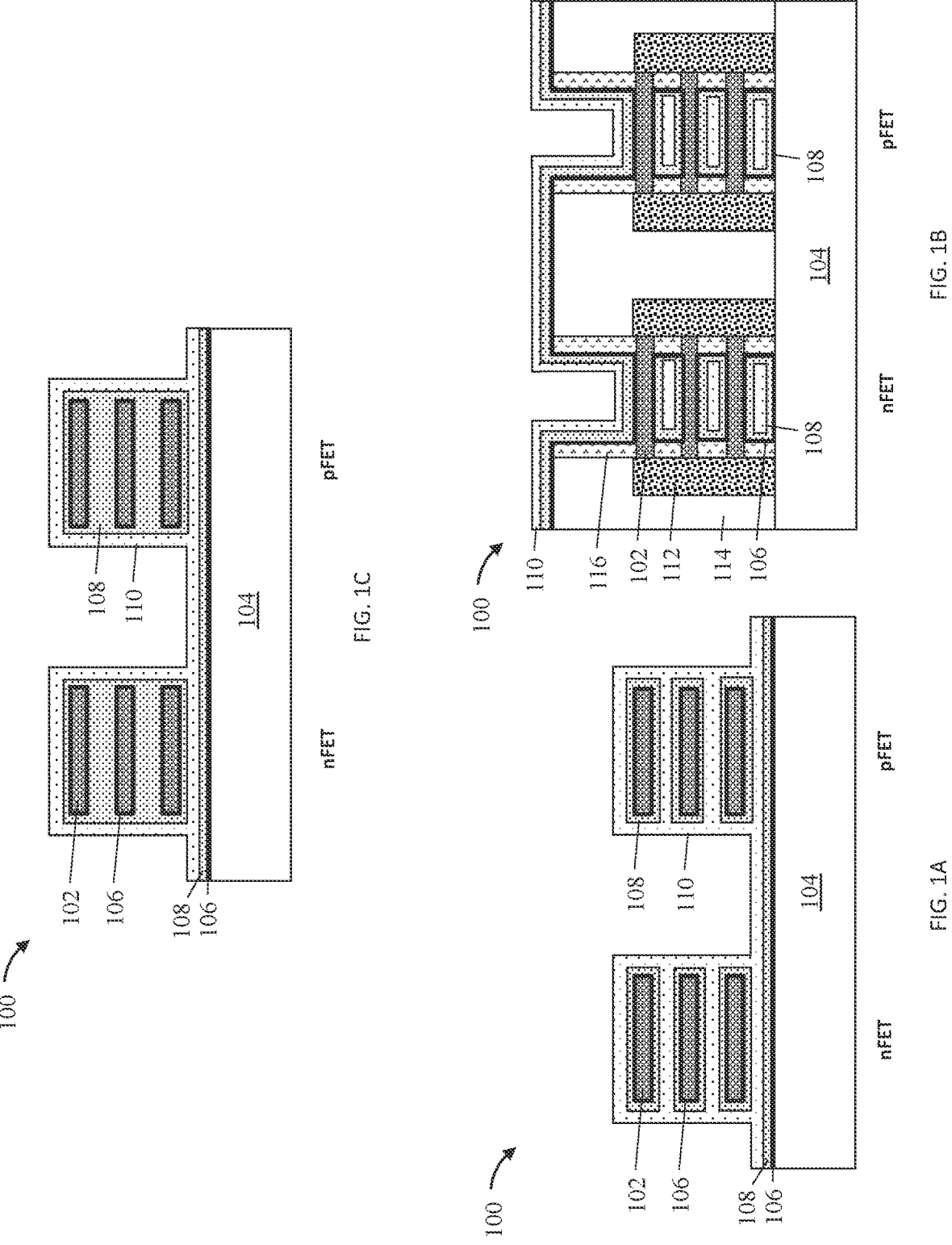
FIG. 1A depicts a cross-sectional view (along gate) of a semiconductor wafer after an initial set of processing operations according to one or more embodiments of the invention.
FIG. 1B depicts a cross-sectional view (across gate) of the semiconductor wafer after the initial set of processing operations according to one or more embodiments of the invention.
FIG. 1C depicts a cross-sectional view (along gate) of an alternative embodiment of the semiconductor wafer 100 shown in FIG. 1A.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

There are several nonplanar transistor architectures for scaling transistors beyond the 7 nm node, but each is currently limited due to various factors. One such architecture is the so-called gate all around (GAA) field effect transistor (FET), sometimes referred to as a nanosheet FET or a nanowire FET. To increase the available computing power per unit area, GAA FET devices vertically stack channels over a shared substrate footprint. The resultant transistor offers several improvements over planar and fin-type devices, such as an increase in gate control, allowing for lower threshold voltages (VDD). Other improvements include variable device widths (additional design flexibility) and longer device widths (improved power, performance, area, cost, collectively PPAC). GAA FET fabrication is challenging, however, and efforts are ongoing to design GAA FET fabrication schemes and structures that are suitable for scaled production.

One challenge is the difficulty in forming high-quality work function metals (WFMs), particular in complementary metal oxide semiconductor (CMOS) devices, as gate length scaling requires a relatively thin WFM in the pFET side (the WFM in the pFET side is commonly referred to as a pWFM) due to patterning constraints. A thin pWFM cannot completely shield the impact of the complementary nWFM (needed for the nFET side) on the pFET. The result is a final device with weakened pFET performance.

Turning now to an overview of aspects of the present invention, one or more embodiments of the invention address the above-described shortcomings by providing fabrication methods and resulting structures for a non-shared metal gate integration of scaled GAA transistors. As used herein, a "non-shared" metal gate integration refers to a structural feature of one or more embodiments of this disclosure where no work function metal stacks, and optionally no gate electrode layers, are shared (or structurally continuous) between the nFET and pFET in the gate stack. Each work function metal stack is either formed by one metal layer or by multiple layers of a same material or of multiple materials. Advantageously, one or more of the work function metals and/or gate electrode materials can be the same for the nFET and pFET, but they are not continuous across the two respective FETs, even in a continuous gate layout. Moreover, gate dielectrics (high-k and interfacial materials) can be shared between the nFET and pFET.

Notably, building scaled GAA transistors having non-shared metal gate integrations according to one or more embodiments isolates the pFET from any deleterious effects caused by the nWFM of the nFET. Accordingly, devices formed according to one or more embodiments have improved pFET performance. Moreover, while discussed primarily with reference to GAA FETs for convenience, embodiments need not be so limited, and other transistor architectures (vertical FETs, Comb-NS, finFETs, etc.) having non-shared metal gate integrations are possible and within the contemplated scope of this disclosure.

Turning now to a more detailed description of fabrication operations and resulting structures according to aspects of the invention, FIG. 1A depicts a cross-sectional view (taken along a gate in a channel region) of a semiconductor wafer 100 after an initial set of fabrication operations have been applied as part of a method of fabricating a final semiconductor device according to one or more embodiments of the invention. FIG. 1B depicts a cross-sectional view (taken across the gate in the channel region) of the semiconductor wafer 100 of FIG. 1A. FIG. 1C depicts a cross-sectional view (taken along the gate in the channel region) of an alternative embodiment of the semiconductor wafer 100 shown in FIG. 1A.

As shown in FIG. 1A, one or more nanosheets 102 (collectively, a nanosheet stack) can be formed over an nFET region of a substrate 104. Similarly, one or more nanosheets 102 can be formed over a pFET region of the substrate 104. The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlInAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a silicon-on-insulator (SOI) layer having a buried oxide layer (not separately shown). The buried oxide layer can be made of any suitable dielectric material, such as, for example, a silicon oxide. In some embodiments of the invention, the buried oxide layer is formed to a thickness of about 10-200 nm, although other thicknesses are within the contemplated scope of the invention.

The one or more nanosheets 102 can include any suitable semiconductor materials, such as, for example, epitaxially grown Si and SiGe layers. For ease of discussion reference is made to operations performed on and to nanosheet stacks having three nanosheets (e.g., the three nanosheets 102 shown in the nFET and pFET regions, respectively, of the substrate 104 in FIG. 1A). It is understood, however, that each nanosheet stack can include any number of nanosheets. For example, each nanosheet stack can include two nanosheets, five nanosheets, eight nanosheets, 30 nanosheets (e.g., 3D NAND), or any number of nanosheets. In some embodiments of the invention, the nanosheets 102 have a thickness of about 4 nm to about 10 nm, for example 6 nm, although other thicknesses are within the contemplated scope of the invention. In some embodiments of the invention, the substrate 104 and the nanosheets 102 can be made of a same semiconductor material. In other embodiments of the invention, the substrate 104 can be made of a first semiconductor material, and the nanosheets 102 can be made of a second, different semiconductor material.

In some embodiments, the one or more nanosheets 102 in the nFET region and the one or more nanosheets 102 in the pFET region include semiconductor materials having a same crystalline orientation. For example, the one or more nanosheets 102 can be silicon layers having a <100> orientation (or <110>, <111>, etc.). In some embodiments, the one or more nanosheets 102 in the nFET region are epitaxially grown at a first crystalline orientation and the one or more nanosheets 102 in the pFET region are epitaxially grown at a second crystalline orientation. For example, the one or more nanosheets 102 in the nFET region can be <100> silicon layers and the one or more nanosheets 102 in the pFET region can be <110> silicon layers (or vice versa).

As further shown in FIG. 1A, a gate dielectric 106 is formed over channel regions of the one or more nanosheets 102. As used herein, the "channel region" refers to the portion of one or more nanosheets 102 over which a conductive gate (described in further detail later) is formed, and through which current passes from source to drain in the final device.

In some embodiments of the invention, the gate dielectric 106 is a high-k dielectric film formed on a surface (sidewall) of the one or more nanosheets 102. The gate dielectric 106 can include an interfacial layer (not separately shown). The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of this disclosure.

A first work function layer 108 (also referred to as a first work function metal or a first work function metal stack) is formed over the gate dielectric 106. The first work function layer 108 is sometimes referred to as a "thin" WFM due to having a thickness which is not sufficient to fully pinch off the space between vertically adjacent nanosheets in the one or more nanosheets 102. Alternatively, FIG. 1C depicts an embodiment of the semiconductor wafer 100 having a relatively thicker first work function layer 108 that pinches off the space between vertically adjacent nanosheets in the one or more nanosheets 102. Processing continues from FIG. 1C in a similar manner as described with respect to FIG. 1A, and is omitted for simplicity.

The first work function layer 108 can include one or more work function layers. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify a work function of a conductive gate in the final device and enables tuning of the device threshold voltage. The work function layers can be formed to a thickness of about 0.5 to 6 nm, although other thicknesses are within the contemplated scope of this disclosure. In some embodiments, the first work function layer 108 includes titanium nitride.

As further shown in FIG. 1A, a first sacrificial material 110 is formed over the first work function layer 108. In embodiments where the first work function layer 108 is a thin WFM, the first sacrificial material 110 can pinch off a remaining gap between vertically adjacent nanosheets in the one or more nanosheets 102 (as illustrated).

The first sacrificial material 110 can be made from a range of materials selected to provide etch selectivity with respect to the material(s) used for the first work function layer 108. For example, in embodiments where the first work function layer 108 is a TiN layer, the first sacrificial material 110 can be $Al_2O_3$. Other materials, such as $La_2O_3$ and low temperature oxide (LTO) are possible and within the contemplated scope of this disclosure. In this manner, portions of the first sacrificial material 110 can be later removed selective to the first work function layer 108 (see, e.g., FIGS. 2A and 2B). The first sacrificial material 110 can be deposited using, for example, atomic layer deposition (ALD) at a deposition temperature of 150 to 400 degrees Celsius (e.g., 300 Celsius), although other deposition methods (PVD, CVD, etc.) are within the contemplated scope of this disclosure.

The semiconductor wafer 100 can include additional structures, some shown and some omitted for clarity, using known FEOL, MOL, and BEOL processes. For example, the semiconductor wafer 100 can include source and drain regions 112 (which can be the same, or different, in the nFET and pFET regions of the substrate 104), an interlayer dielectric 114, and spacers 116 (including, e.g., sidewall spacers and/or inner spacers), configured and arranged as shown.

Figures 2A, 2B:
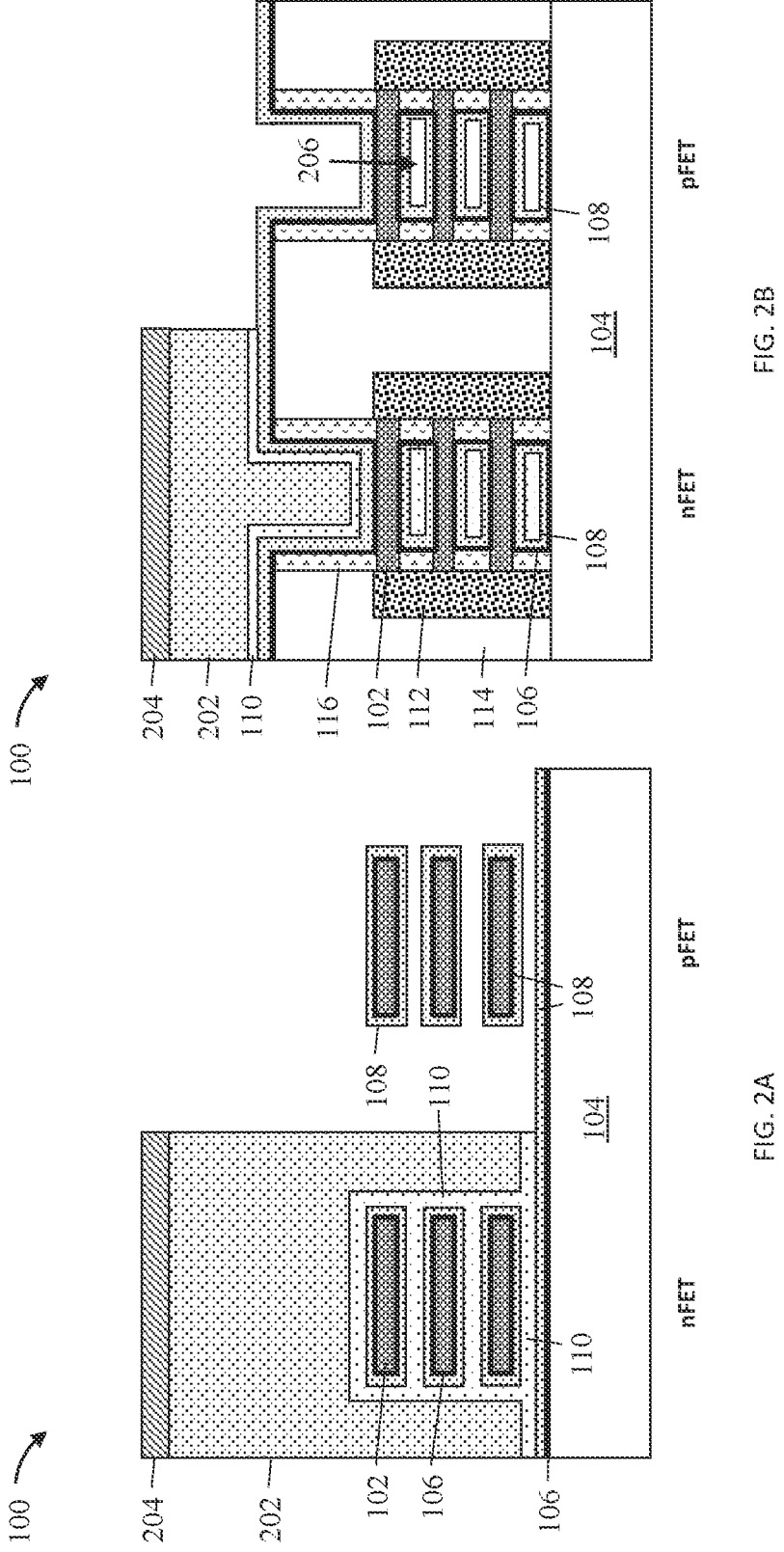
FIG. 2A depicts a cross-sectional view (along gate) of the semiconductor wafer after a processing operation according to one or more embodiments of the invention.
FIG. 2B depicts a cross-sectional view (across gate) of the semiconductor wafer after a processing operation according to one or more embodiments of the invention.

FIGS. 2A and 2B depict along-gate, and across-gate cross-sectional views, respectively, of the semiconductor wafer 100 after a processing operation according to one or more embodiments. As shown in FIG. 2A, a block material 202 is formed over the nFET region of the substrate 104. In some embodiments, the block material 202 includes, for example, an organic planarization layer (OPL), although other materials are within the contemplated scope of this disclosure.

In some embodiments, the block material 202 is deposited over the semiconductor wafer 100 and then patterned using, for example, a mask layer 204 and/or a combination of wet and/or dry etches. In some embodiments, the mask layer 204 is opened in the pFET region (as shown) and exposed portions of the block material 202 are removed. Materials for the mask layer 204 are not meant to be particularly limited, but can include, for example, $TiO_x$.

As further shown in FIGS. 2A and 2B, exposed portions of the first sacrificial material 110 are removed in the pFET region, exposing the first work function layer 108 and leaving a gap 206 between the one or more nanosheets 102. Observe that the gap 206 is not formed in embodiments where pinch off is achieved using the first work function layer 108 (e.g., embodiments of FIG. 1C). As discussed previously, the first sacrificial material 110 can be removed selective to the first work function layer 108. In some embodiments, the first sacrificial material 110 is also removed selective to the mask layer 204 and/or the block material 202.

Figures 3A, 3B:
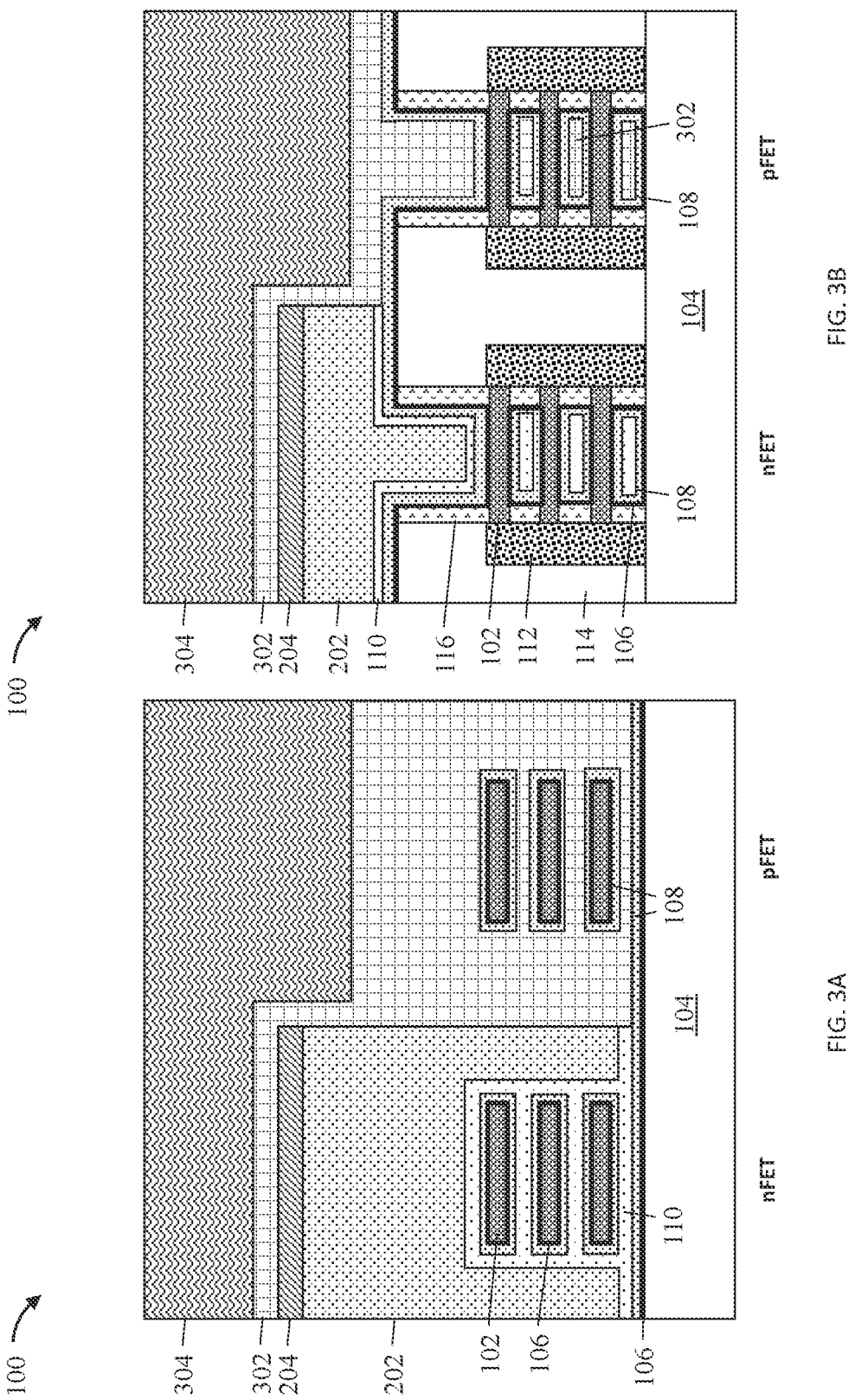
FIG. 3A depicts a cross-sectional view (along gate) of the semiconductor wafer after a processing operation according to one or more embodiments of the invention.
FIG. 3B depicts a cross-sectional view (across gate) of the semiconductor wafer after a processing operation according to one or more embodiments of the invention.

FIGS. 3A and 3B depict along-gate, and across-gate cross-sectional views, respectively, of the semiconductor wafer 100 after a processing operation according to one or more embodiments. As shown in FIG. 3A, a second sacrificial material 302 is formed over the first work function layer 108 in the pFET region of the substrate 104 and over the mask layer 204 in the nFET region of the substrate 104.

Figures 7A, 7B:
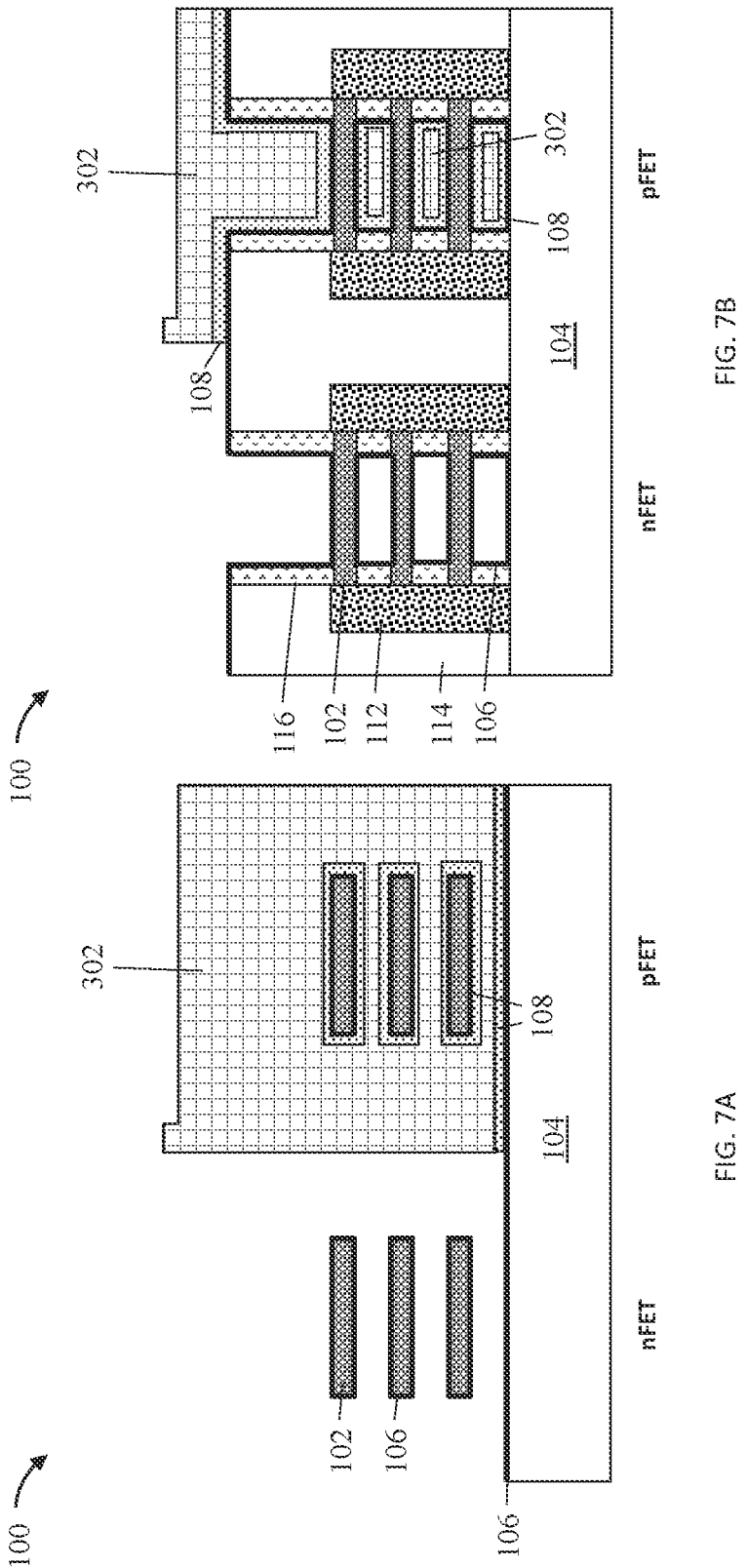
FIG. 7A depicts a cross-sectional view (along gate) of the semiconductor wafer after a processing operation according to one or more embodiments of the invention.
FIG. 7B depicts a cross-sectional view (across gate) of the semiconductor wafer after a processing operation according to one or more embodiments of the invention.
Figures 8A, 8B:
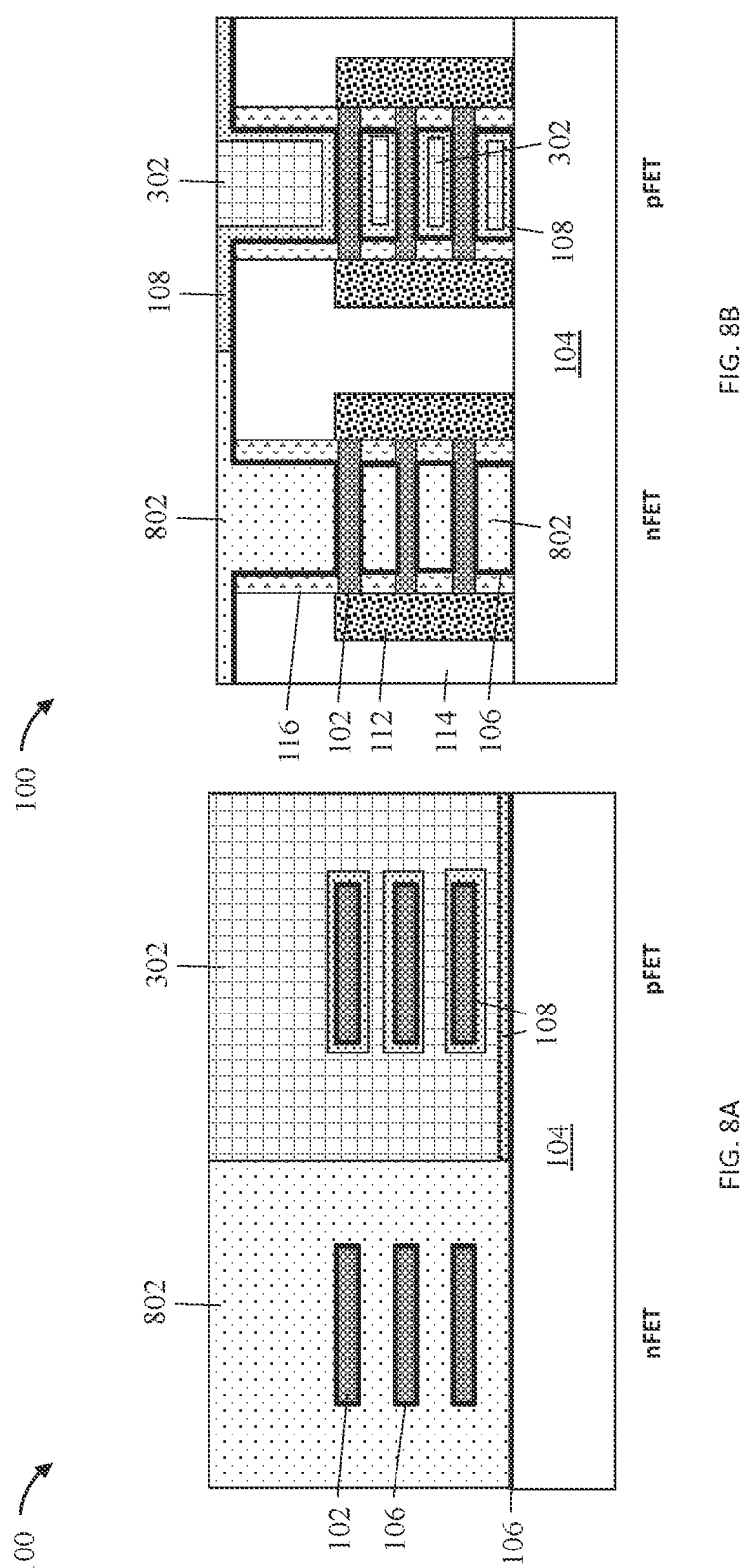
FIG. 8A depicts a cross-sectional view (along gate) of the semiconductor wafer after a processing operation according to one or more embodiments of the invention.
FIG. 8B depicts a cross-sectional view (across gate) of the semiconductor wafer after a processing operation according to one or more embodiments of the invention.

The second sacrificial material 302 can be made from a range of materials selected to provide etch selectivity with respect to the material(s) used for the first work function layer 108, the first sacrificial material 110, and the second work function layer 802 (FIG. 8A). For example, in embodiments where the first work function layer 108 is a TiN layer and the first sacrificial material 110 is $Al_2O_3$, the second sacrificial material 302 can be a $La_2O_3$ layer. In this manner, portions of the first work function layer 108 and first sacrificial material 110 can be removed selective to the second sacrificial material 302 (see, e.g., FIG. 7A) and the second sacrificial material 302 can be removed selective to the first work function layer 108 and the second work function layer 802 (see, e.g., FIG. 9B). The second sacrificial material 302 can be deposited using, for example, atomic layer deposition (ALD) at a deposition temperature of 150 to 400 degrees Celsius (e.g., 300 Celsius), although other deposition methods (PVD, CVD, etc.) are within the contemplated scope of this disclosure.

As further shown in FIG. 3A, a second block material 304 is formed over the nFET and pFET regions of the substrate 104. In some embodiments, the second block material 304 includes, for example, an organic planarization layer (OPL) formed in a similar manner as the block material 202 discussed previously with respect to FIG. 2A, although other materials are within the contemplated scope of this disclosure.

Figures 4A, 4B:
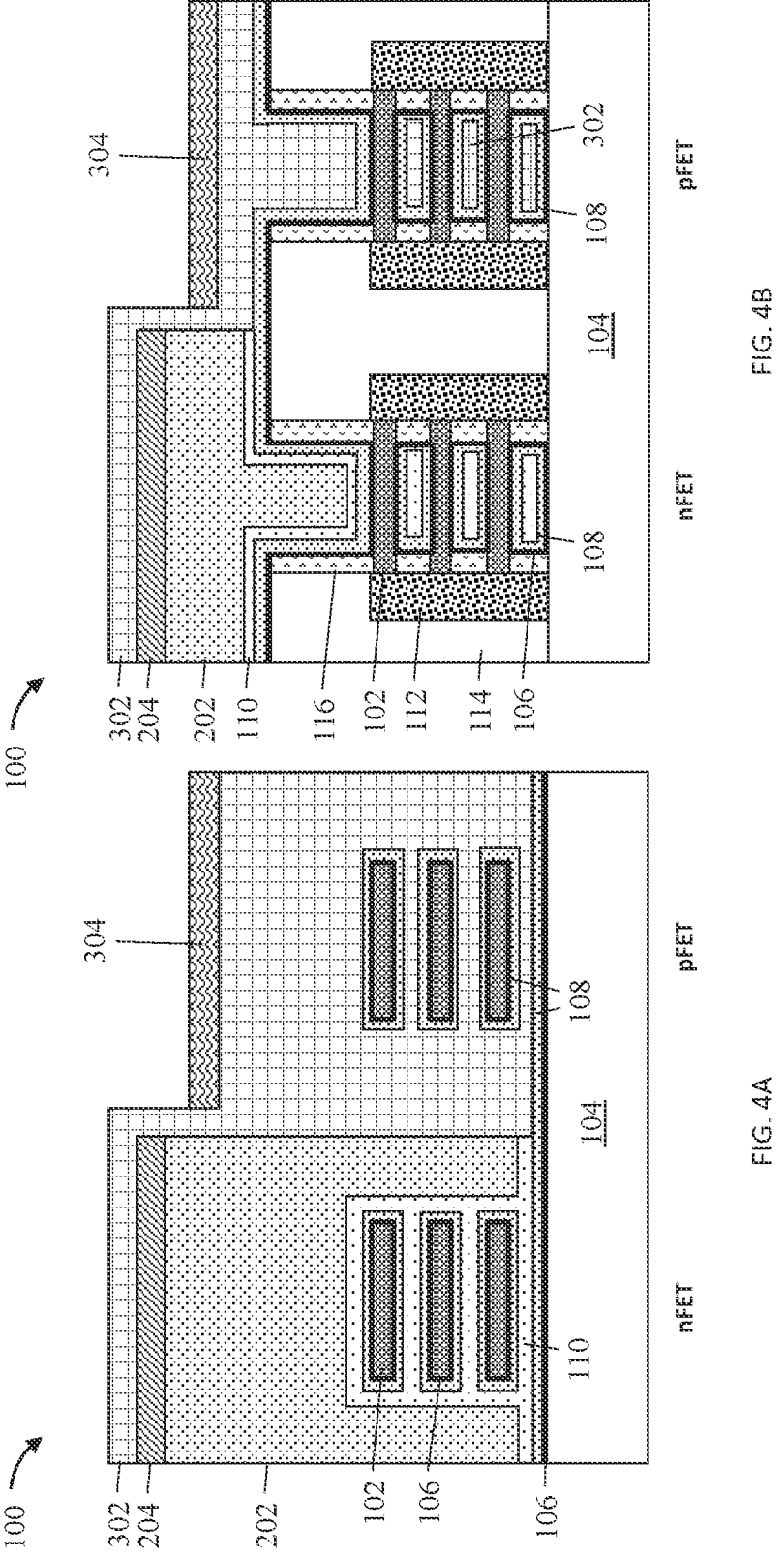
FIG. 4A depicts a cross-sectional view (along gate) of the semiconductor wafer after a processing operation according to one or more embodiments of the invention.
FIG. 4B depicts a cross-sectional view (across gate) of the semiconductor wafer after a processing operation according to one or more embodiments of the invention.

FIGS. 4A and 4B depict along-gate, and across-gate cross-sectional views, respectively, of the semiconductor wafer 100 after a processing operation according to one or more embodiments. As shown in FIG. 4A, the second block material 304 is recessed below a surface of the second sacrificial material 302. The second block material 304 can be recessed using, for example, ashing, a wet etch, a dry etch, or a combination of sequential wet and/or dry etches.

Figures 5A, 5B:
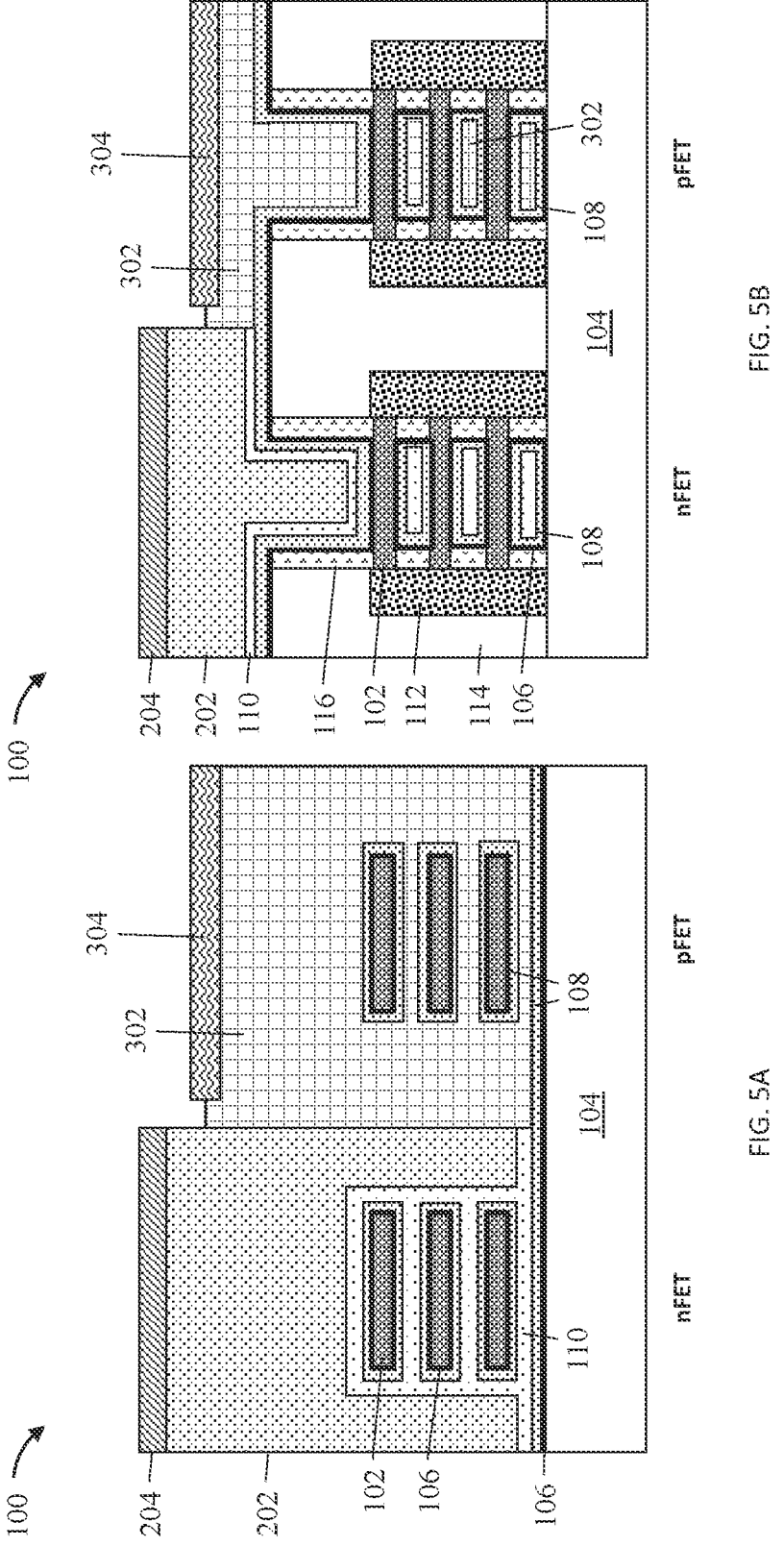
FIG. 5A depicts a cross-sectional view (along gate) of the semiconductor wafer after a processing operation according to one or more embodiments of the invention.
FIG. 5B depicts a cross-sectional view (across gate) of the semiconductor wafer after a processing operation according to one or more embodiments of the invention.

FIGS. 5A and 5B depict along-gate, and across-gate cross-sectional views, respectively, of the semiconductor wafer 100 after a processing operation according to one or more embodiments. As shown in FIG. 5A, the second sacrificial material 302 is recessed to expose a surface of the mask layer 204 in the nFET region of the substrate 104. In some embodiments, the second sacrificial material 302 is recessed below a surface of the second block material 304 in the pFET region of the substrate 104 (as illustrated). The second sacrificial material 302 can be recessed using, for example, a wet etch, a dry etch, or a combination of sequential wet and/or dry etches.

Figures 6A, 6B:
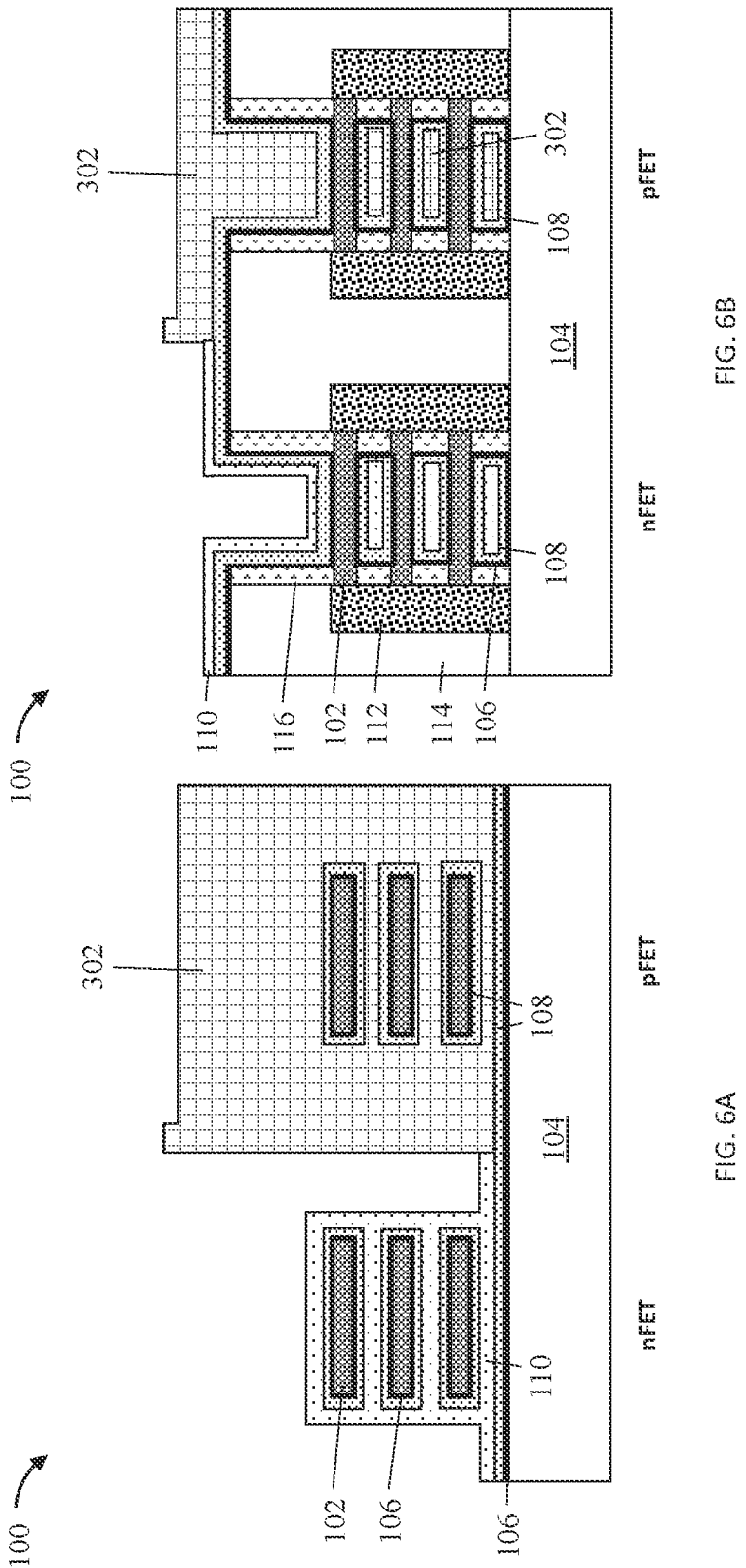
FIG. 6A depicts a cross-sectional view (along gate) of the semiconductor wafer after a processing operation according to one or more embodiments of the invention.
FIG. 6B depicts a cross-sectional view (across gate) of the semiconductor wafer after a processing operation according to one or more embodiments of the invention.

FIGS. 6A and 6B depict along-gate, and across-gate cross-sectional views, respectively, of the semiconductor wafer 100 after a processing operation according to one or more embodiments. As shown in FIG. 6A, the mask layer 204 is removed using, for example, a hard mask stripping process. Once the mask layer 204 is removed, the block material 202 and the second block material 304 are removing, using, for example an OPL ashing process.

FIGS. 7A and 7B depict along-gate, and across-gate cross-sectional views, respectively, of the semiconductor wafer 100 after a processing operation according to one or more embodiments. As shown in FIG. 7A, the first work function layer 108 and the first sacrificial material 110 are removed in the nFET region of the substrate 104. The first work function layer 108 and the first sacrificial material 110 can be removed a wet etch, a dry etch, or a combination of sequential wet and/or dry etches. In some embodiments, the first work function layer 108 and the first sacrificial material 110 are removed selective to the second sacrificial material 302.

FIGS. 8A and 8B depict along-gate, and across-gate cross-sectional views, respectively, of the semiconductor wafer 100 after a processing operation according to one or more embodiments. As shown in FIG. 8A, a second work function layer 802 (also referred to as a second work function metal or a second work function metal stack) is formed in the nFET region of the substrate 104. In some embodiments, the second work function layer 802 includes a gate electrode (not separately shown).

The second work function layer 802 can include one or more work function layers. The work function layers can be made of, for example, aluminum, titanium, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify a work function of a conductive gate in the final device and enables tuning of the device threshold voltage. The work function layers can be formed to a thickness of about 0.5 to 6 nm, although other thicknesses are within the contemplated scope of this disclosure. In some embodiments, the second work function layer 802 includes nFET work function materials, such as, for example, aluminum or another metal having a work function close to the conduction band of Si (or SiGe, etc.). For example, a work function metal having a work function of about 4 eV (e.g., 3.8 to 4.5 eV).

As further shown in FIGS. 8A and 8B, the semiconductor wafer 100 can be polished (planarized) to expose top surfaces of the first work function layer 108 and the second sacrificial material 302 in the pFET region of the substrate 104. The semiconductor wafer 100 can be polished using any suitable method, such as, for example, chemical mechanical planarization (CMP) and/or wafer grinding.

Figures 9A, 9B:
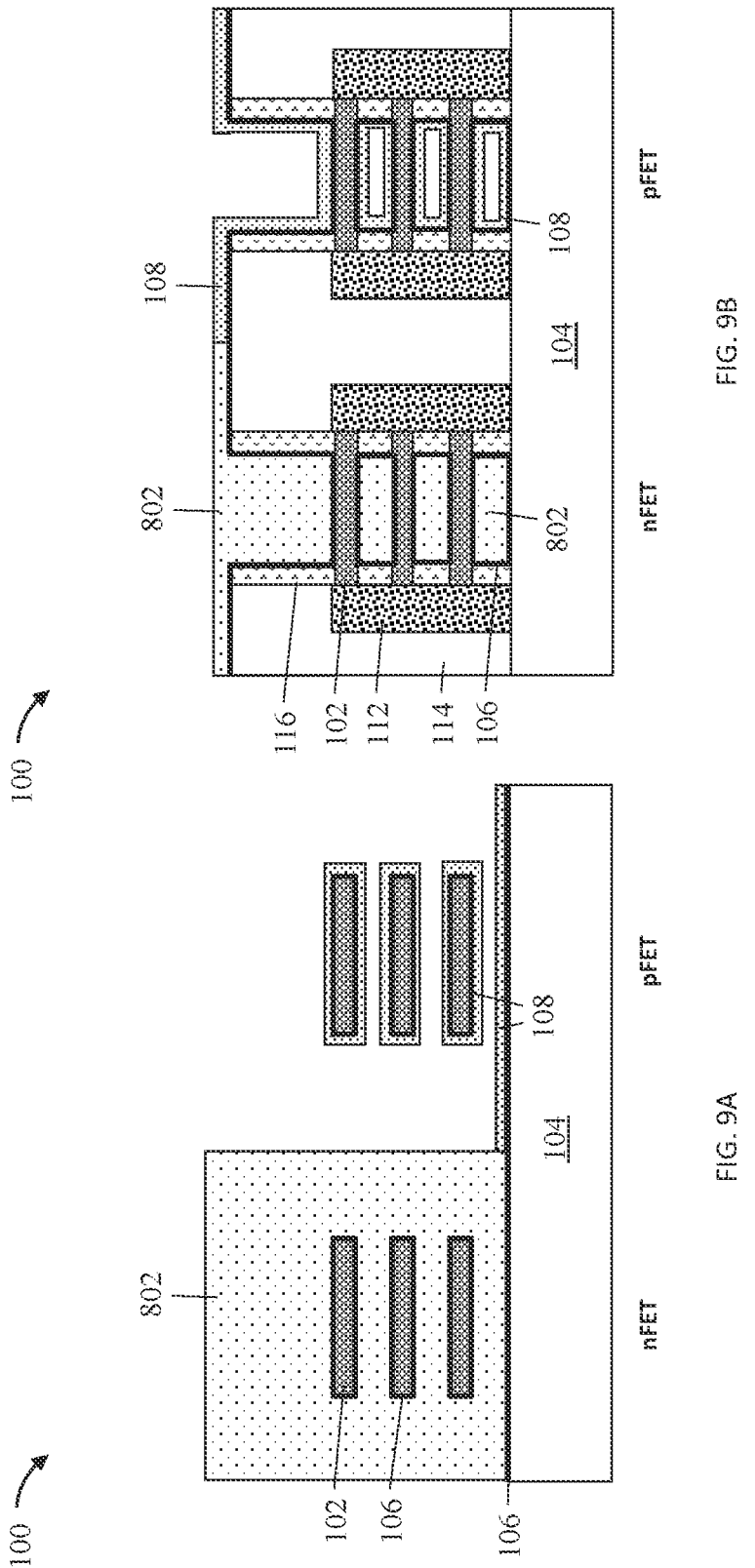
FIG. 9A depicts a cross-sectional view (along gate) of the semiconductor wafer after a processing operation according to one or more embodiments of the invention.
FIG. 9B depicts a cross-sectional view (across gate) of the semiconductor wafer after a processing operation according to one or more embodiments of the invention.

FIGS. 9A and 9B depict along-gate, and across-gate cross-sectional views, respectively, of the semiconductor wafer 100 after a processing operation according to one or more embodiments. As shown in FIG. 9B, the second sacrificial material 302 is removed from the pFET region of the substrate 104. The second sacrificial material 302 can be removed a wet etch, a dry etch, or a combination of sequential wet and/or dry etches. In some embodiments, the second sacrificial material 302 is removed selective to the first work function layer 108 and the second work function layer 802.

Figures 10A, 10B:
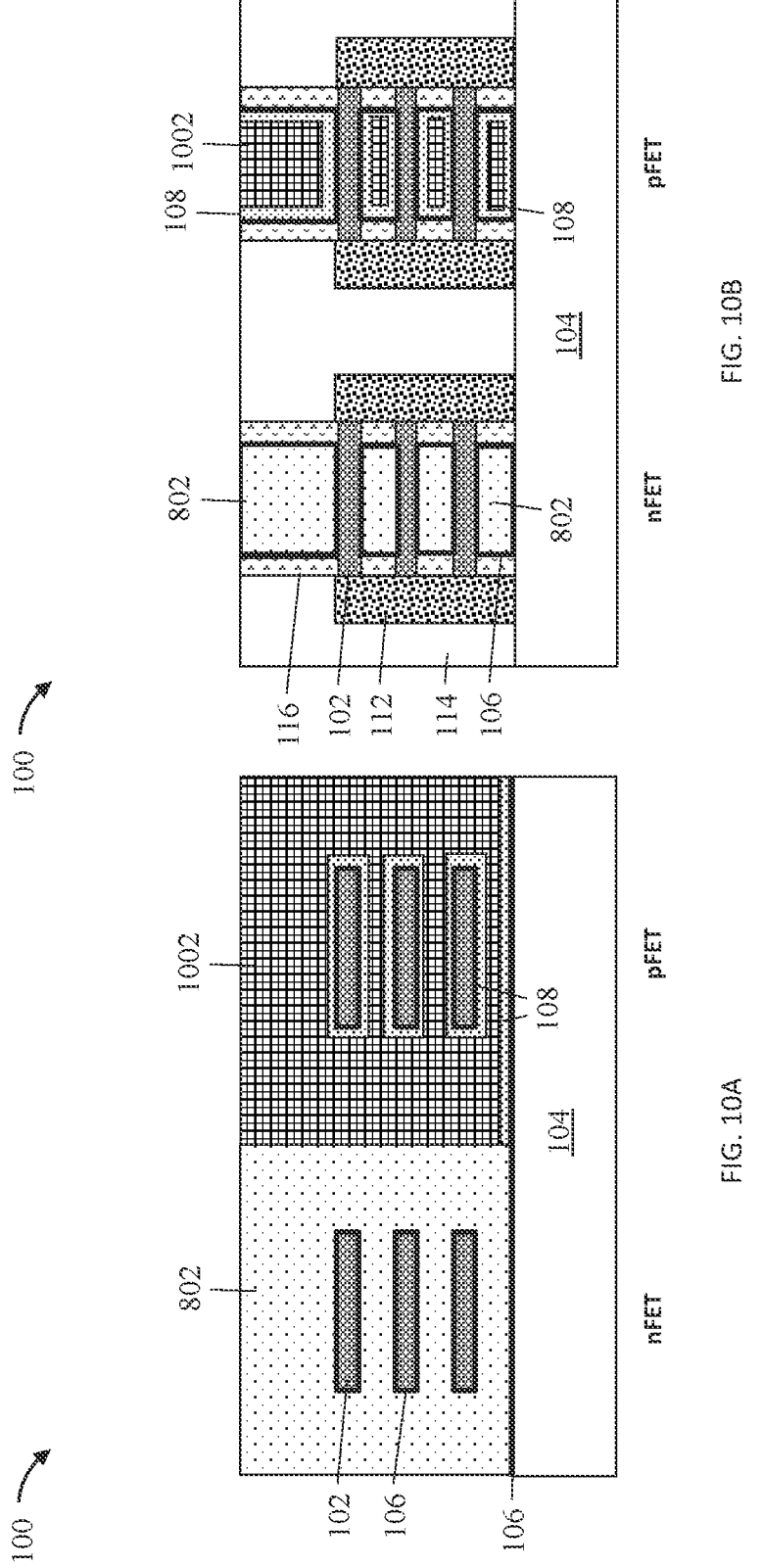
FIG. 10A depicts a cross-sectional view (along gate) of the semiconductor wafer after a processing operation according to one or more embodiments of the invention.
FIG. 10B depicts a cross-sectional view (across gate) of the semiconductor wafer after a processing operation according to one or more embodiments of the invention.

FIGS. 10A and 10B depict along-gate, and across-gate cross-sectional views, respectively, of the semiconductor wafer 100 after a processing operation according to one or more embodiments. As shown in FIG. 10A, a third work function layer 1002 (also referred to as a third work function metal or a third work function metal stack) is formed in the pFET region of the substrate 104. In some embodiments, the third work function layer 1002 includes a gate electrode (not separately shown).

The third work function layer 1002 can include one or more work function layers. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify a work function of a conductive gate in the final device and enables tuning of the device threshold voltage. The work function layers can be formed to a thickness of about 0.5 to 6 nm, although other thicknesses are within the contemplated scope of this disclosure. In some embodiments, the third work function layer 1002 includes pFET work function materials, such as, for example, TiN or another metal having a work function close to the valence band of Si (or SiGe, etc.). For example, a work function metal having a work function of about 5 eV (e.g., 4.8 to 5.2 eV). Observe that the first work function layer 108 and the third work function layer 1002 together define a pWFM stack in the pFET region of the substrate 104.

As further shown in FIG. 10A, the semiconductor wafer 100 can be polished (planarized) to expose top surfaces of the spacers 116. The semiconductor wafer 100 can be polished using any suitable method as described previously, such as, for example, CMP and/or wafer grinding.

After wafer grinding (or CMP, etc.) is complete, the semiconductor wafer 100 can be finalized using known FEOL, MOL, and BEOL processes to define the final device. Note that the prior figures discuss a process flow where the nFET region is blocked first (see, e.g., FIG. 2A) for convenience and simplicity only. It should be understood that, in some embodiments, the pFET region is blocked first. In other words, aspects of this disclosure are compatible with either nFET first and pFET first process flows.

FIG. 11 depicts a flow diagram illustrating a method 1100 for a non-shared metal gate integration of transistors according to one or more embodiments of the invention. As shown at block 1102, a first nanosheet stack is formed in a first region of a substrate and a second nanosheet stack is formed in a second region of the substrate. In some embodiments, the first region of the substrate is an nFET region and the second region of the substrate is a pFET region (or vice versa).

At block 1104, a first work function metal stack is formed around one or more nanosheets in the first nanosheet stack and one or more nanosheets in the second nanosheet stack. In some embodiments, the first work function metal stack pinches off a space between vertically adjacent nanosheets in the first nanosheet stack and/or the second nanosheet stack.

At block 1106, a first sacrificial material is formed around the first work function metal stack in the first nanosheet stack and the first work function metal stack in the second nanosheet stack. In some embodiments, a portion of the first sacrificial material pinches off a space between vertically adjacent nanosheets in the first nanosheet stack and/or the second nanosheet stack.

At block 1108, the first sacrificial material in the second nanosheet stack is replaced with a second sacrificial material. In some embodiments, replacing the first sacrificial material in the second nanosheet stack with a second sacrificial material includes removing the first sacrificial material from the second nanosheet stack, and forming the second sacrificial material around the first work function metal stack in the second nanosheet stack.

At block 1110, the first sacrificial material and the first work function metal stack in the first nanosheet stack are replaced with a second work function metal stack. In some embodiments, replacing the first sacrificial material and the first work function metal stack in the first nanosheet stack with a second work function metal stack includes removing the first sacrificial material and the first work function metal stack from the first nanosheet stack, and forming the second work function metal stack around the one or more nanosheets in the first nanosheet stack.

At block 1112, the second sacrificial material in the second nanosheet stack is replaced with a third work function metal stack. In some embodiments, replacing the second sacrificial material in the second nanosheet stack with a third work function metal stack includes removing the second sacrificial material from the second nanosheet stack, and forming a third work function metal stack around the first work function metal stack in the second nanosheet stack.

FIG. 12 depicts a flow diagram illustrating a method 1200 for a non-shared metal gate integration of transistors according to one or more embodiments of the invention. As shown at block 1202, a first semiconductor structure is formed in a first region of a substrate. In some embodiments, the first semiconductor structure includes a first gate formed over channel regions of the first semiconductor structure.

At block 1204, a second semiconductor structure is formed in a second region of the substrate. In some embodiments, the second semiconductor structure includes a second gate formed over channel regions of the second semiconductor structure.

In some embodiments, the first semiconductor structure and the second semiconductor structure are configured with a non-shared metal gate integration such that the second gate includes a first work function metal stack and a third work function metal stack and the first gate comprises a second work function metal stack. In other words, in some embodiments, no work function metal stacks are shared between the first semiconductor structure and the second semiconductor structure.

In some embodiments, gate dielectrics are shared between the first gate and the second gate (even in embodiments where no work function metal stacks are shared). In some embodiments, no gate electrode layers are shared between the first semiconductor structure and the second semiconductor structure.

In some embodiments, the second work function metal stack in the first gate includes a same material as one of the first work function metal stack and the third work function metal stack in the second gate, but the work function metals having a same material are not continuous across the first semiconductor structure and the second semiconductor structure. In some embodiments, the first gate and the second gate define a continuous gate layout.

In some embodiments, the first semiconductor structure includes a first nanosheet stack and the first region is an nFET region, and the second semiconductor structure includes a second nanosheet stack and the second region is a pFET region. In some embodiments, the first work function metal stack pinches off a space between vertically adjacent nanosheets in the second nanosheet stack.

In some embodiments, the first semiconductor structure includes one or more semiconductor fins and the second semiconductor structure includes one or more semiconductor fins.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a first nanosheet stack in a first region of a substrate and a second nanosheet stack in a second region of the substrate;

forming a first work function metal stack around one or more nanosheets in the first nanosheet stack and one or more nanosheets in the second nanosheet stack;

forming a first sacrificial material around the first work function metal stack in the first nanosheet stack and the first work function metal stack in the second nanosheet stack;

replacing the first sacrificial material in the second nanosheet stack with a second sacrificial material;

replacing the first sacrificial material and the first work function metal stack in the first nanosheet stack with a second work function metal stack; and replacing the second sacrificial material in the second nanosheet stack with a third work function metal stack.

2. The method of claim 1, wherein the first work function metal stack pinches off a space between vertically adjacent nanosheets.

3. The method of claim 1, wherein a portion of the first sacrificial material pinches off a space between vertically adjacent nanosheets.

4. The method of claim 1, wherein replacing the first sacrificial material in the second nanosheet stack with the second sacrificial material comprises:

removing the first sacrificial material from the second nanosheet stack; and forming the second sacrificial material around the first work function metal stack in the second nanosheet stack.

5. The method of claim 1, wherein replacing the first sacrificial material and the first work function metal stack in the first nanosheet stack with the second work function metal stack comprises:

removing the first sacrificial material and the first work function metal stack from the first nanosheet stack; and forming the second work function metal stack around the one or more nanosheets in the first nanosheet stack.

6. The method of claim 1, wherein replacing the second sacrificial material in the second nanosheet stack with the third work function metal stack comprises:

removing the second sacrificial material from the second nanosheet stack; and forming a third work function metal stack around the first work function metal stack in the second nanosheet stack.

7. The method of claim 1, wherein the first region of the substrate comprises an nFET region and the second region of the substrate comprises a pFET region.

8. A method for forming a semiconductor device, the method comprising:

forming a first semiconductor structure in a first region of a substrate, the first semiconductor structure comprising a first gate in a non-shared metal gate integration; and forming a second semiconductor structure in a second region of the substrate, the second semiconductor structure comprising a second gate in the non-shared metal gate integration;

wherein the second gate comprises a first work function metal stack and a third work function metal stack;

wherein the first gate comprises a second work function metal stack; and wherein gate dielectrics are shared between the first gate and the second gate.

9. The method of claim 8, wherein the non-shared metal gate integration is structured such that no work function metal stacks are shared between the first semiconductor structure and the second semiconductor structure.

10. The method of claim 8, wherein the second work function metal stack in the first gate comprises a same material as one of the first work function metal stack and the third work function metal stack in the second gate, but the work function metals having a same material are not continuous across the first semiconductor structure and the second semiconductor structure.

11. The method of claim 10, wherein the first gate and the second gate comprises a continuous gate layout.

12. The method of claim 8, wherein the first semiconductor structure comprises a first nanosheet stack and the first region comprises an nFET region, and the second semiconductor structure comprises a second nanosheet stack and the second region comprises a pFET region.

13. The method of claim 12, wherein the first work function metal stack pinches off a space between vertically adjacent nanosheets in the second nanosheet stack.

14. The method of claim 8, wherein the first semiconductor structure comprises one or more semiconductor fins and the second semiconductor structure comprises one or more semiconductor fins.

* * * * *